United States Patent
Ishibashi et al.

(10) Patent No.: US 10,388,581 B2
(45) Date of Patent: Aug. 20, 2019

(54) SEMICONDUCTOR DEVICE HAVING PRESS-FIT TERMINALS DISPOSED IN RECESSES IN A CASE FRAME

(71) Applicant: Mitsubishi Electric Corporation, Tokyo (JP)

(72) Inventors: Hidetoshi Ishibashi, Tokyo (JP); Shinsuke Asada, Tokyo (JP); Yoshitaka Kimura, Tokyo (JP); Minoru Egusa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/959,353

(22) Filed: Apr. 23, 2018

(65) Prior Publication Data

US 2019/0103330 A1 Apr. 4, 2019

(30) Foreign Application Priority Data

Oct. 3, 2017 (JP) ................................. 2017-193299

(51) Int. Cl.
| H01L 23/48 | (2006.01) |
| H01L 23/055 | (2006.01) |
| H01L 23/31 | (2006.01) |
| H01R 12/58 | (2011.01) |
| H01L 23/00 | (2006.01) |

(52) U.S. Cl.
CPC ........ *H01L 23/055* (2013.01); *H01L 23/3121* (2013.01); *H01L 24/48* (2013.01); *H01R 12/585* (2013.01); *H01L 2224/45124* (2013.01); *H01L 2224/48157* (2013.01)

(58) Field of Classification Search
CPC ..................................................... H01L 23/055
USPC ......................................................... 257/697
See application file for complete search history.

(56) References Cited

U.S. PATENT DOCUMENTS

| 5,945,727 A * | 8/1999 | Ishiwa | H01R 43/16 257/666 |
| 2011/0256749 A1* | 10/2011 | Bayerer | H01R 12/585 439/345 |
| 2016/0336245 A1* | 11/2016 | Egusa | H01R 12/585 |

FOREIGN PATENT DOCUMENTS

| JP | 2015-023226 A | 2/2015 |
| JP | 2016-219778 A | 12/2016 |
| JP | 2018-133481 A | 8/2018 |

* cited by examiner

*Primary Examiner* — Caleb E Henry
(74) *Attorney, Agent, or Firm* — Studebaker & Brackett PC

(57) ABSTRACT

A semiconductor device includes an insulating substrate, a semiconductor element provided on the insulating substrate, a case frame, a press-fit terminal, and a sealing member provided on an inner side of an inner wall part on the insulating substrate to seal the semiconductor element. The case frame is made of an insulating material and includes an outer wall part, an inner wall part, a recess bottom surface forming a recess together with the outer wall part and the inner wall part. The press-fit terminal includes a base part, a body part, and a press-in portion. The base part is embedded in the recess bottom surface and the body part stands upright from the recess bottom surface such that the body part extends between the inner wall part and the outer wall part, and the press-in portion protrudes up out of the recess.

6 Claims, 5 Drawing Sheets

A-A SECTION-VIEW

B-B SECTION-VIEW

C-C SECTION-VIEW

SEMICONDUCTOR DEVICE HAVING PRESS-FIT TERMINALS DISPOSED IN RECESSES IN A CASE FRAME

BACKGROUND

1. Technical Field

The present application relates to a semiconductor device.

2. Description of the Related Art

Conventionally, as disclosed, for example, in Japanese Patent Application Laid-open No. 2015-023226, semiconductor devices are known, wherein signal terminals stand upright on the bottom surface of a cavity formed in a case frame. The signal terminals in this conventional semiconductor device are normal terminals and not press-fit terminals. The cavity is provided presumably for allowing a connector to be inserted.

SUMMARY

A press-fit terminal includes a base part, a body part extending upright from the base part, and a press-in portion provided at one end of the body part. The press-in portion of the press-fit terminal is inserted into a through hole of a printed circuit board or the like. When the press-in portion is inserted into the through hole, it is firmly pressed against the through hole. This pressure contact between the press-in portion and the through hole provides mechanical and electrical connection between the printed circuit board or the like and the press-fit terminal.

Press-fit terminals should preferably be able to tolerate deformation to some extent when a load is applied. To be more specific, fitting the through hole of the printed circuit board with the press-in portion of the press-fit terminal applies a load to the press-in portion, and this load to the press-in portion acts to compress the press-fit terminal in an axial direction. When the through hole and press-in portion are misaligned, another force acts to deflect the press-fit terminal sideways. The body part can flexibly deflect to allow the press-fit terminal to receive these various forces. The longer the body part of the press-fit terminal, the higher the deformation tolerance of the press-fit terminal can be when a load is applied to the press-in portion. Deformation tolerance is a feature necessary for the connection principle of press-fit terminals and therefore considered not significant for conventional connector terminals.

Insulation properties of semiconductor devices covered in a sealing member can be increased by making the sealing member thicker. The thicker the sealing member, the higher its upper surface will be positioned. If the press-fit terminal is provided such as to stand on the upper surface of the sealing member, making the sealing member thick will cause most of the body part of the press-fit terminal to be embedded in the resin. If the body part is made to protrude sufficiently long from the upper surface of the sealing member to avoid this, the overall height dimension of the semiconductor device, which is the sum of the length of the press-fit terminal and the thickness of the sealing member, will be increased. There was thus a problem that the height dimension of the semiconductor device would be increased if the deformation tolerance of press-fit terminals is to be achieved as well as the electrical insulation by the sealing resin is to be ensured.

It is an object of the application to provide an improved semiconductor device that can achieve both of electrical insulation properties of the semiconductor device and deformation tolerance of press-fit terminals while suppressing an increase of the height dimension of the semiconductor device.

A semiconductor device according to the present application, includes: an insulating substrate; a semiconductor element provided on the insulating substrate; a case frame; a press-fit terminal; and a sealing member. The case frame is made of an insulating material and is provided along peripheral edges of the insulating substrate such as to surround the semiconductor element in plan view of the insulating substrate. The case frame includes an outer wall part, an inner wall part provided closer to a center side of the insulating substrate than the outer wall part, a recess bottom surface sandwiched between the outer wall part and the inner wall part and forming a recess together with the outer wall part and the inner wall part. The press-fit terminal includes a base part connected to the semiconductor element via a wire, a body part standing upright from the base part, and a press-in portion provided at an upper end of the body part. The base part is embedded in the recess bottom surface and the body part stands upright from the recess bottom surface such that the body part extends in an interspace between the inner wall part and the outer wall part. The press-in portion protrudes up out of the recess. The sealing member is provided on an inner side of the inner wall part on the insulating substrate to seal the semiconductor element.

The features and advantages of the present disclosure (or embodiments) may be summarized as follows.

DESCRIPTION OF THE EMBODIMENTS

Embodiment 1

Figure 1:
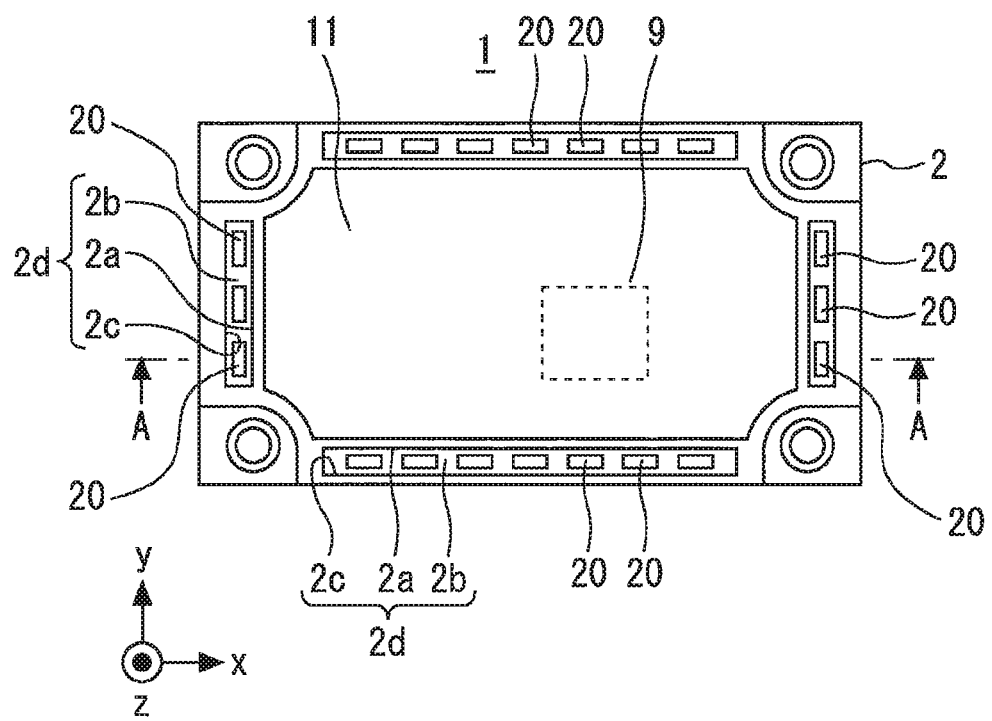
FIG. 1 is a plan view illustrating a semiconductor device according to Embodiment 1.
Figure 2:
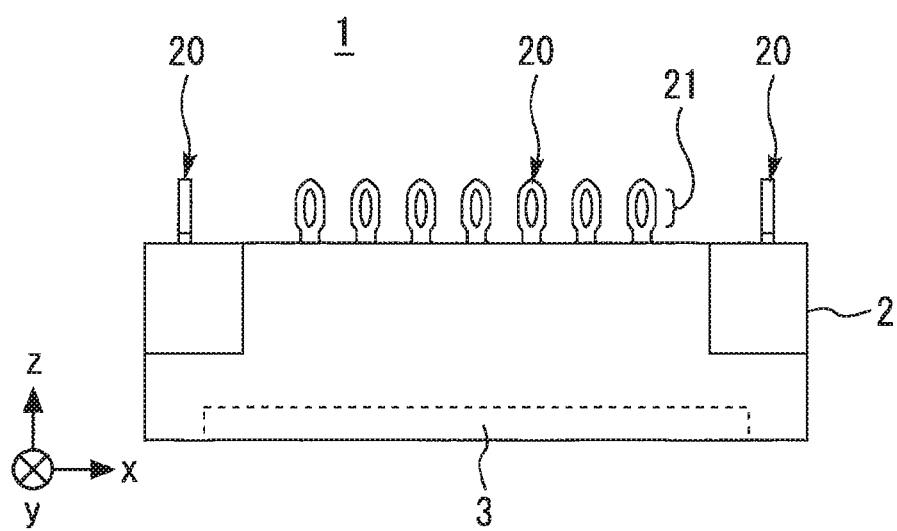
FIG. 2 is a side view of the semiconductor device according to Embodiment 1.
Figure 3:
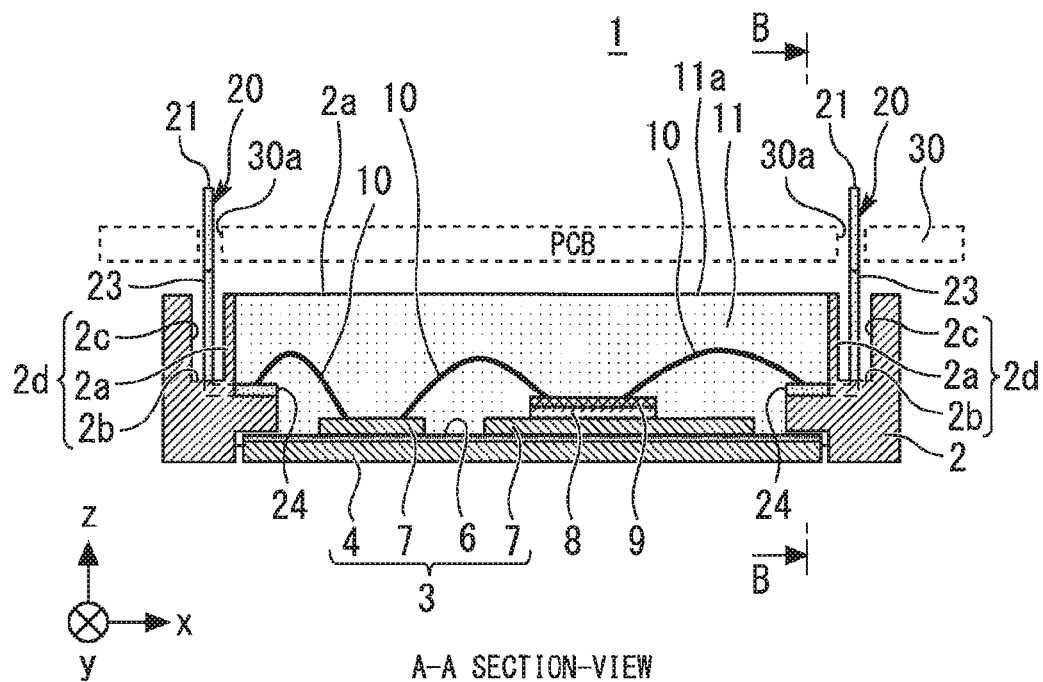
FIG. 3 is a cross-sectional view along line A-A in FIG. 1 of the semiconductor device according to Embodiment 1.

FIG. 1 is a plan view illustrating a semiconductor device 1 according to Embodiment 1. FIG. 2 is a side view of the semiconductor device 1 according to Embodiment 1. FIG. 3 is a cross-sectional view along line A-A in FIG. 1 of the semiconductor device 1 according to Embodiment 1.

FIG. 1 and FIG. 2 illustrate the outer appearance of the semiconductor device 1. The semiconductor device 1 includes a case frame 2, an insulating substrate 3, a semiconductor element 9, a sealing member 11, and press-fit terminals 20. For convenience of explanation, an up-and-down direction will be referred to in describing the structure of the semiconductor device 1. This up-and-down direction is a direction defined relative to the insulating substrate 3 as a reference. The up-and-down direction merely indicates a positional relationship relative to the insulating substrate 3, and does not limit the relationship relative to the vertical direction and horizontal direction. The relationships between various parts of the semiconductor device 1 and the vertical/horizontal directions are defined in accordance with the direction in which the semiconductor device 1 is attached. FIG. 1, FIG. 2, and other drawings indicate xyz orthogonal coordinate axes for convenience of explanation. The z direction indicates the "up" direction of the semiconductor device 1, which is also the "height" direction of the semiconductor device 1. The z direction also indicates the "thickness" direction of various parts of the semiconductor device 1. The x direction indicates the "length dimension" of the semiconductor device 1, and the y direction indicates the "width dimension" of the semiconductor device 1.

The internal structure of the semiconductor device 1 will be described with reference to FIG. 3. The insulating substrate 3 and the case frame 2 make up the case of the semiconductor device 1. The insulating substrate 3 includes a base plate 4, an insulating layer 6 provided on the front surface of the base plate 4, and a circuit pattern 7 formed on the insulating layer 6. The insulating substrate 3 can be regarded as a circuit board having the circuit pattern 7 for mounting the semiconductor element 9 on the surface. The base plate 4 and the circuit pattern 7 are made of a metal material. More specifically, aluminum or copper may be used as this metal material. For the insulating layer 6, epoxy resin or the like may be used, with a ceramic filler mixed therein.

The semiconductor element 9 is provided on the insulating substrate 3. More specifically, the semiconductor element 9 is mounted on the circuit pattern 7 formed on the insulating substrate 3 via a bonding agent 8. One example of bonding agent 8 is solder. The semiconductor element 9 is connected to the pattern by metal wires 10 such as aluminum wires. The semiconductor element 9 may be a switching element. More specifically, the semiconductor element 9 may be an IGBT or MOS-FET. The semiconductor element 9 may be made of a silicone material, or, the semiconductor element 9 may be made of a wide-bandgap semiconductor material that has a wider bandgap than silicone. Wide-bandgap semiconductors may be made of SiC, GaN, or diamond. An inverter circuit is formed by the semiconductor element 9 and the circuitry on the insulating substrate 3. Although not shown, diode elements that form the inverter circuit may be provided inside the semiconductor device 1.

The case frame 2 is provided along peripheral edges of the insulating substrate 3 such as to surround the semiconductor element 9 in plan view of the insulating substrate 3 shown in FIG. 1. The case frame 2 includes inner wall parts 2a, recess bottom surfaces 2b, and outer wall parts 2c. The inner wall parts 2a are positioned closer to the center of the insulating substrate 3 than the outer wall parts 2c. The recess bottom surfaces 2b are each sandwiched between the outer wall parts 2c and the inner wall parts 2a, and configure recesses 2d together with the outer wall parts 2c and inner wall parts 2a. The case frame 2 is formed from an insulating material. Preferably, the case frame 2 is made of engineering plastic that has high insulating properties.

Figure 4:
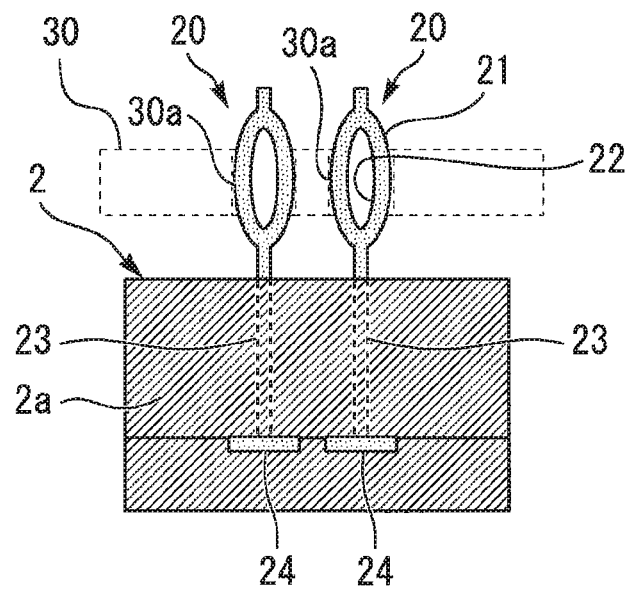
FIG. 4 is a cross-sectional view along line B-B in FIG. 3 of the semiconductor device according to Embodiment 1.

FIG. 4 is a cross-sectional view along line B-B in FIG. 3 of the semiconductor device 1 according to Embodiment 1. The press-fit terminal 20 includes a base part 24, a body part 23 standing upright from the base part 24, and a press-in portion 21 at the upper end of the body part 23. The press-fit terminal 20 is substantially L-shaped and fixed to the case frame 2. The connecting portion between the base part 24 and the body part 23 is embedded in the recess bottom surface 2b. The distal end of the base part 24 is exposed from the case frame 2. The distal end of the base part 24 is connected to the semiconductor element 9 by the metal wire 10. The body part 23 stands vertically upright from the recess bottom surface 2b. The body part 23 extends in an interspace between the inner wall part 2a and the outer wall part 2c. The press-in portion 21 protrudes up out of the recess 2d. The press-fit terminal 20 is preferably made of copper alloy, and the surface thereof is plated with Ni, Sn or the like. Although not shown in the simplified illustration in FIG. 4, the press-fit terminal in Embodiment 1 includes a constricted portion 23a in the body part 23 as shown in FIG. 5 which will be described below.

The press-in portion 21 has an elliptic ring-like structure with an opening 22 in the center. The press-in portion 21 with the opening 22 provides the press-fit function. The press-in portion 21 is press-fit into a through hole 30a of the printed circuit hoard 30, whereby the press-fit terminal 20 is electrically connected to the through hole 30a. The press-fit terminal 20 functions as a terminal of a main circuit and a control circuit.

Figure 5:
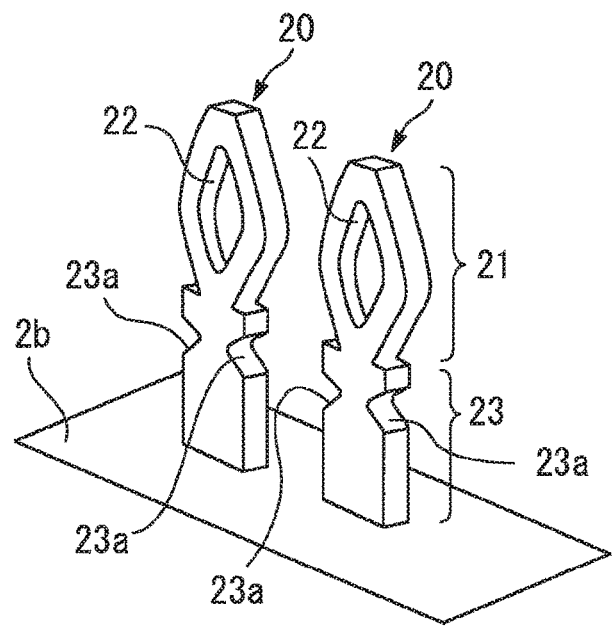
FIG. 5 is a perspective view illustrating the press-fit terminals of the semiconductor device according to Embodiment 1.

FIG. 5 is a perspective view illustrating the press-fit terminals 20 of the semiconductor device 1 according to Embodiment 1. The body part 23 has the constricted portion 23a. The constricted portion 23a is a portion of the body part 23 where the width is reduced. The constricted portion 23a is positioned higher than the recess bottom surface 2b inside the recess 2d.

The semiconductor element 9 is covered by the sealing member 11 so that it is insulated and sealed. The sealing member 11 fills the space inside the inner wall parts 2a on the insulating substrate 3. The sealing member 11 may fill the inner space up to the same height as the upper ends of the inner wall parts 2a, or, the upper surface 11a of the sealing member 11 may be positioned lower than the upper ends of the inner wall parts 2a. In either case, the upper surface 11a of the sealing member 11 is positioned higher than the recess bottom surfaces 2b. For the sealing member 11, hard epoxy resin with silica having insulating properties, or silicone gel and the like may be used.

In FIG. 3 and FIG. 4, the printed circuit board 30 is shown by broken lines for convenience of illustration. When the semiconductor device 1 is in actual operation, the printed circuit board 30 is placed to overlap the upper surface 11a of the sealing member 11. The printed circuit board 30 includes through holes 30a. The press-in portions 21 of the press-fit terminals 20 are inserted into the through holes 30a.

In this semiconductor device 1, the body parts 23 stand upright from the recess bottom surfaces 2b, so that the length of the portion of the body parts 23 that is not embedded in the insulating material can be made larger. If the body parts 23 of the press-fit terminals 20 are entirely fixed by the sealing member 11, the deformation tolerance against thermal stress will be deteriorated, and the deformation tolerance against, for example, misalignment relative to the through holes 30a of the printed circuit board 30 will also be degraded. In this semiconductor device 1, it is ensured that the body parts 23 are not embedded in the sealing member, so that the deformation tolerance of the press-fit terminal 20 when a load is applied to the press-in portion 21 can be enhanced. When the semiconductor element 9 is made of SiC, in particular, the thermal stress generated during the operation of the semiconductor device 1 will be accordingly high, since SiC semiconductor devices are capable of operating at high temperatures. In this semiconductor device 1, the press-fit terminals 20 can exhibit high deformation tolerance against thermal stress during such high-temperature operations. The inside space of the inner wall parts 2a can be filled with the sealing member 11 such as to cover the semiconductor element 9, whereby the sealing member 11 can be provided up to near the upper ends of the inner wall parts 2a. Thus the sealing member 11 covering the semiconductor element 9 can have a sufficient thickness, so that electric insulation is ensured.

The recesses 2d between the inner wall parts 2a and the outer wall parts 2c provide open space for allowing the body parts 23 to deflect. Even if the sealing member 11 fills up the space nearly to the upper ends of the inner wall parts 2a to make the sealing member 11 thick, the body parts 23 will not be embedded in the sealing member 11. Thus, making the sealing member 11 thick, and keeping the body parts 23 of the press-fit terminals 20 freely deformable, can both be achieved, with the use of the inner wall parts 2a and recesses 2d of the case frame 2. Accordingly, reliable electrical insulation of the semiconductor device 1 and improved deformation tolerance of the press-fit terminals 20 are both achieved, with minimal increase in the overall height dimension of the semiconductor device 1.

When the material of the sealing member 11 is poured onto the semiconductor element 9, it is ensured that the body parts 23 of the press-fit terminals 20 are exposed from the sealing member 11, because of the recesses 2d formed in the case frame 2. It is another advantage that the material injection process of the sealing member 11 can be carried out more easily.

In Embodiment 1, the constricted portion 23a is provided. The constricted portion 23a enables the press-fit terminal 20 to deform more easily in accordance with a misalignment relative to the through hole 30a and environmental thermal stresses. This way, the reliability of the semiconductor device 1 is improved even more. Even if the through holes 30a of the printed circuit board 30 and the press-fit terminals 20 are not in alignment, such misalignment can be absorbed as the constricted portions 23a easily deform. This prevents the press-in portions 21 from undergoing abnormal defamation due to excessive stress, or prevents damage to the through holes, and thereby ensures stable conduction quality between the contacts. Note, however, the constricted portion 23a may be omitted, as one variation of the press-fit terminal 20.

The semiconductor device 1 has a built-in inverter circuit. With the semiconductor device 1, which provides high levels of size reduction, electrical insulation, and connection reliability of press-fit terminals, compact inverter units of consistent quality can be obtained.

Figure 6:
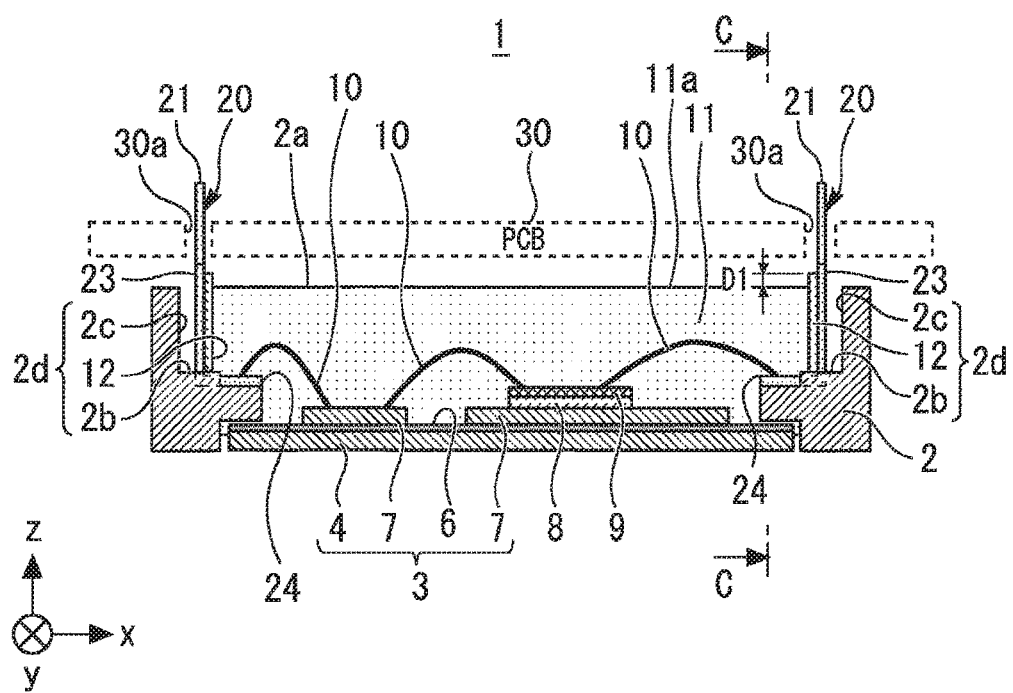
FIG. 6 is a cross-sectional view of the semiconductor device according to a variation example of Embodiment 1.

FIG. 6 is a cross-sectional view of the semiconductor device 1 according to a variation example of Embodiment 1. In the variation example of FIG. 6, the case frame 2 is formed in a shape that does not have inner wall parts 2a. The case frame 2 immediately after the molding does not have inner wall parts 2a. Instead, inner wall parts 12 are formed after that in the variation example of FIG. 6 by fixedly attaching an insulating member to the recess bottom surfaces 2b of the case frame 2. That is, an insulating member that is molded separately from the case frame 2 is attached, to provide the inner wall parts 12. There are no limitations on the material of the inner wall parts 12 as long as it has insulating properties. It may be made of a resin material, for example. For molding the case frame 2 that includes the inner wall parts 2a and recess bottom surfaces 2b integrally as shown in FIG. 1, the metal molds need to be fabricated such that the recesses 2d will have a certain size to be large enough in consideration of resin moldability. On the other hand, by forming the inner wall parts 12 with separate parts as in this variation example, the width of the recesses 2d can be minimized, and the press-fit terminals 20 can be made as close to the inner wall parts 12 and outer wall parts 2c as possible. This enables a size reduction of the semiconductor device 1. In the variation example of FIG. 6, the upper surface 11a of the sealing member 11 is positioned lower than the upper ends of the inner wall parts 12, by a difference of D1. Note, however, the upper surface 11a of the sealing member 11 may be made flush with the upper ends of the inner wall parts 12 in the variation example of FIG. 6.

Figure 7:
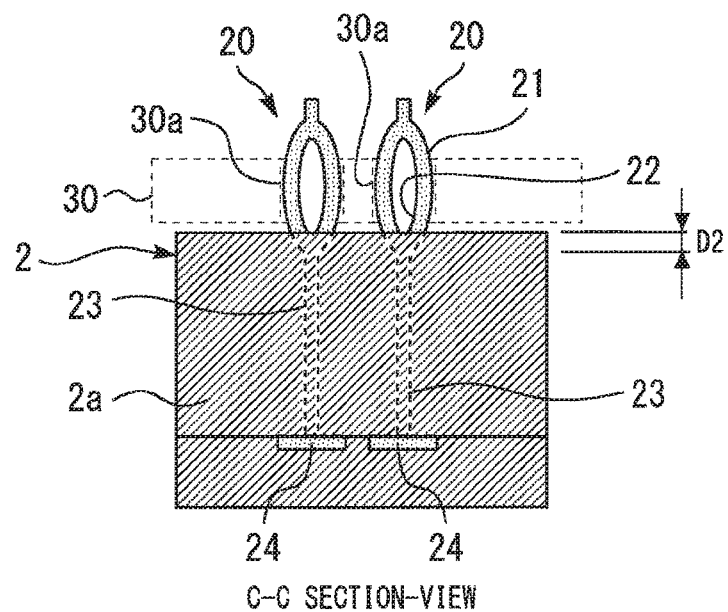
FIG. 7 is a cross-sectional view of the semiconductor device according to a variation example of Embodiment 1.

FIG. 7 is a cross-sectional view of the semiconductor device 1 according to a variation example of Embodiment 1. As shown in FIG. 7, the upper end of the inner wall part 2a may be positioned lower than a center position of the press-in portion 21 and higher than a connecting position between the press-in portion 21 and the body part 23. In FIG. 7, the lower end of the press-in portion 21 is positioned tower than the upper end of the inner wall part 2a by a distance of D2. With the lower end of the press-in portion 21 being positioned lower than the inner wall part 2a, the distal end position of the press-fit terminal 20 can be made lower, which will enable a further reduction in thickness of the semiconductor device 1. Since the upper end of the inner wall part 2a is positioned lower than the center position of the press-in portion 21, the press-in portion 21 can be inserted into the through hole 30a without hindrance. The inner wall parts 2a can prevent the sealing member 11 from adhering to the press-in portions 21, so that the reliability of the press-fit connection can be ensured.

Various known press-fit structures can be applied to the press-fit terminals 20. Some known press-fit terminals have a "press-in portion without the opening 22". Such known press-fit terminals without the opening 22 may also be used instead of the press-fit terminals 20.

As one variation of the insulating substrate 3, it may have an insulating circuit board made of ceramics or the like instead of the insulating layer 6 and circuit pattern 7. Insulating substrates having the base plate 4 and a ceramic insulating circuit board laid thereon are already known and will not be described further.

Embodiment 2

Figure 8:
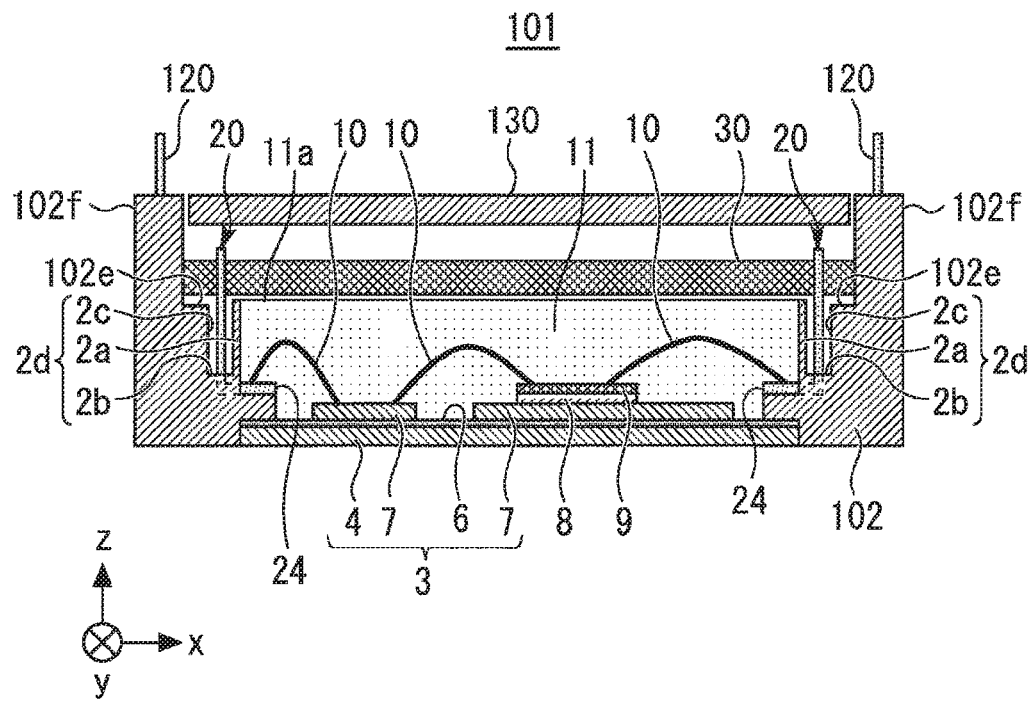
FIG. 8 is a cross-sectional view of a semiconductor device according to Embodiment 2 at the position corresponding to the line A-A of FIG. 1.

FIG. 8 is a cross-sectional view of a semiconductor device 101 according to Embodiment 2 at the position corresponding to the line A-A of FIG. 1. The difference between Embodiment 1 and Embodiment 2 is whether the press-fit terminals 20 and printed circuit board 30 are positioned outside or inside the semiconductor device 101. The semiconductor device 101 according to Embodiment 2 has the press-fit terminals 20 accommodated inside the semiconductor device 101 as internal electrodes. The printed circuit board 30 is also accommodated inside the semiconductor device 101. The advantageous effects described in Embodiment 1 are achieved also when providing the semiconductor device 101 designed as an intelligent power module having the printed circuit board 30 mounted inside, whereby the height dimension of the semiconductor device 101 can be reduced.

Unlike Embodiment 1, the printed circuit board 30 is disposed inside the case frame 102, and a lid 130 is placed over the printed circuit board 30. The case frame 102 and lid 130 should preferably be made of engineering plastic that has high insulating properties.

The case frame 102 includes inner wall parts 2a, recess bottom surfaces 2b, and outer wall parts 2c, similarly to Embodiment 1. The case frame 102 according to Embodiment 2 additionally has a step 102e and an outer frame part 102f on the outer side of the outer wall parts 2c of the case frame 102. Peripheral edges of the printed circuit board 30 overlap the step 102e. External electrode terminals 120 are provided at the upper end of the outer frame part 102f. The external electrode terminals 120 are connected to the printed circuit board 30, the circuit pattern 7 or the like via wires (not shown).

The lid 130 is attached to the case frame 102 such as to overlap the printed circuit board 30. The lid 130 covers the press-fit terminals 20 and printed circuit board 30. In Embodiment 2, the press-fit terminals 20 function as internal electrode terminals of the semiconductor device 101.

Figure 9:
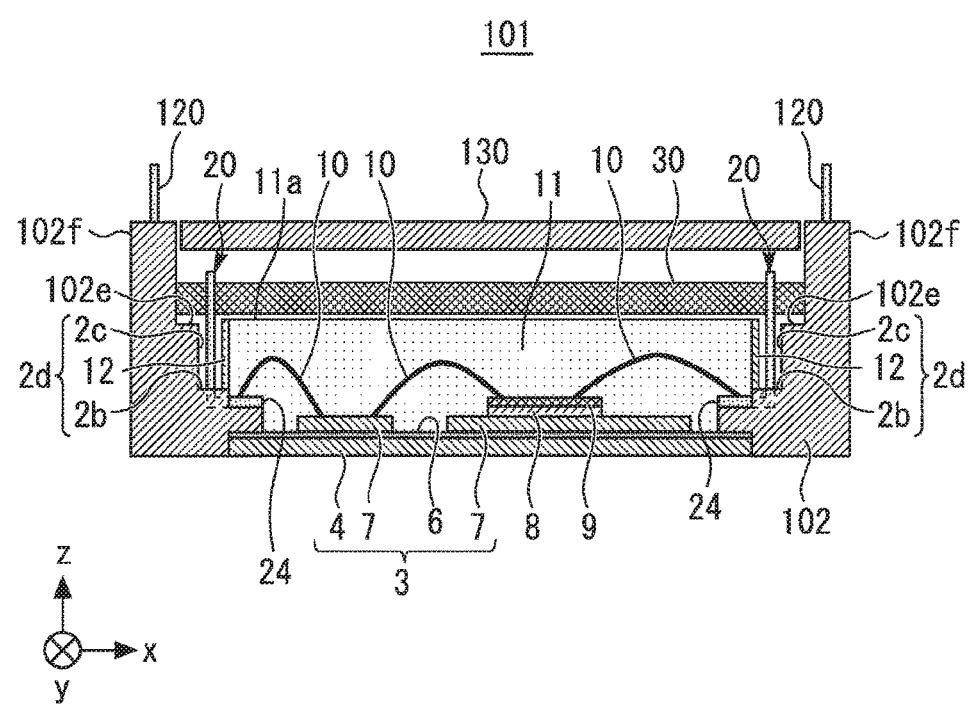
FIG. 9 is a cross-sectional view of the semiconductor device according to a variation example of Embodiment 2.

FIG. 9 is a cross-sectional view of the semiconductor device 101 according to a variation example of Embodiment 2. Similarly to the variation example of FIG. 6, the inner wall parts 12 may be formed by fixedly attaching an insulating member to the recess bottom surfaces 2b.

A variation of Embodiment 1 similar to that described with reference to FIG. 7 is also possible. Namely, the upper ends of the inner wall parts 2a may be positioned lower than the center position of the press-in portions 21 and higher than the connecting position between the press-in portions 21 and the body parts 23.

Various other changes similar to Embodiment 1 can be made to Embodiment 2, too. While FIG. 4 and FIG. 7 show protrusions at the upper ends of the press-in portions 21, these protrusions may be omitted. They are not shown in FIG. 2, FIG. 3, FIG. 5 and other drawings for the sake of simplicity.

The features and advantages of the present disclosure (or embodiments) may be summarized as follows. According to the present disclosure, the sealing member can be made thick, as well as the body parts of the press-fit terminals can be kept freely deformable, with the use of inner wall parts and recesses of the case frame. Accordingly, reliable electrical insulation of the semiconductor device and improved deformation tolerance of the press-fit terminals are both achieved, while suppressing an increase in the overall height dimension of the semiconductor device.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2017-193299, filed on Oct. 3, 2017 including specification, claims, drawings and summary, on which the Convention priority of the present application is based, is incorporated herein by reference in its entirety.

What is claimed is:

1. A semiconductor device, comprising:
   an insulating substrate;
   a semiconductor element provided on the insulating substrate;
   a case frame made of an insulating material and provided along peripheral edges of the insulating substrate such as to surround the semiconductor element in plan view of the insulating substrate, the case frame including an outer wall part, an inner wall part provided closer to a center side of the insulating substrate than the outer wall part, a recess bottom surface sandwiched between the outer wall part and the inner wall part and forming a recess together with the outer wall part and the inner wall part;
   a press-fit terminal including a base part connected to the semiconductor element via a wire, a body part standing upright from the base part, and a press-in portion provided at an upper end of the body part, the base part being embedded in the recess bottom surface and the body part standing upright from the recess bottom surface such that the body part extends in an interspace between the inner wall part and the outer wall part while remaining entirely out of physical contact with at least one of the inner wall part and the outer wall part, and the press-in portion protrudes up out of the recess; and
   a sealing member provided on an inner side of the inner wall part on the insulating substrate to seal the semiconductor element.

2. The semiconductor device according to claim 1, wherein the body part includes a constricted portion positioned higher than the recess bottom surface inside the recess.

3. The semiconductor device according to claim 1, wherein the inner wall part is an insulating member fixedly attached on the recess bottom surface.

4. The semiconductor device according to claim 1, wherein the inner wall part has an upper end positioned lower than a center position of the press-in portion and higher than a connecting position between the press-in portion and the body part.

5. The semiconductor device according to claim 1, wherein the body part of the press-fit terminal that extends in the interspace between the inner wall part and the outer wall part remains out of contact with the inner wall part and the outer wall part.

6. The semiconductor device according to claim 1, wherein the recess where the terminal does not contact is hollow.

\* \* \* \* \*